United States Patent
Nogami

(10) Patent No.: US 10,242,928 B2
(45) Date of Patent: Mar. 26, 2019

(54) SEMICONDUCTOR DEVICE

(71) Applicant: Mitsubishi Electric Corporation, Tokyo (JP)

(72) Inventor: Yoichi Nogami, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 75 days.

(21) Appl. No.: 14/796,674

(22) Filed: Jul. 10, 2015

(65) Prior Publication Data

US 2016/0099193 A1    Apr. 7, 2016

(30) Foreign Application Priority Data

Oct. 3, 2014   (JP) ................................. 2014-204754

(51) Int. Cl.
| H01L 23/31 | (2006.01) |
| H01L 23/00 | (2006.01) |
| H01L 23/58 | (2006.01) |

(52) U.S. Cl.
CPC ........ *H01L 23/3157* (2013.01); *H01L 23/564* (2013.01); *H01L 23/585* (2013.01); *H01L 2224/18* (2013.01); *H01L 2224/32225* (2013.01); *H01L 2924/19041* (2013.01); *H01L 2924/19042* (2013.01); *H01L 2924/19043* (2013.01); *H01L 2924/19104* (2013.01)

(58) Field of Classification Search
None
See application file for complete search history.

(56) References Cited

U.S. PATENT DOCUMENTS

| 6,897,133 B2 | 5/2005 | Collard |
| 2002/0180005 A1 | 12/2002 | Haematsu |

(Continued)

FOREIGN PATENT DOCUMENTS

| JP | H02-275656 A | 11/1990 |
| JP | 2002-359257 A | 12/2002 |

(Continued)

OTHER PUBLICATIONS

An Office Action, "Notification of Reasons for Refusal," issued by the Japanese Patent Office dated Oct. 3, 2017, which corresponds to Japanese Patent Application No. 2014-204754 and is related to U.S. Appl. No. 14/796,674; with English translation.

(Continued)

*Primary Examiner* — Samuel Gebremariam
*Assistant Examiner* — Jonas T Beardsley
(74) *Attorney, Agent, or Firm* — Studebaker & Brackett PC

(57) ABSTRACT

A semiconductor device includes: a semiconductor substrate having a main plane; a semiconductor element provided on the main plane of the semiconductor substrate; an electrode pad provided on the main plane of the semiconductor substrate and connected to the semiconductor element; a guard ring surrounding the semiconductor element and the electrode pad, and provided on the main plane of the semiconductor substrate; and an insulating film covering all region of a semiconductor of the main plane of the semiconductor substrate exposed inside the guard ring, wherein the insulating film is made of a water impermeable material.

20 Claims, 4 Drawing Sheets

(56) References Cited

U.S. PATENT DOCUMENTS

| | | | |
|---|---|---|---|
| 2005/0127395 A1* | 6/2005 | Saigoh | H01L 23/564 257/127 |
| 2008/0224174 A1 | 9/2008 | Sasaki et al. | |
| 2008/0315257 A1* | 12/2008 | Shiraishi | H01L 27/0605 257/195 |
| 2010/0155582 A1* | 6/2010 | Hirano | H01L 27/14636 250/227.11 |
| 2010/0244199 A1* | 9/2010 | Sakuma | H01L 21/78 257/618 |
| 2012/0153355 A1* | 6/2012 | Umeda | H01L 29/2003 257/192 |
| 2012/0211859 A1* | 8/2012 | Stribley | H01L 29/402 257/484 |
| 2013/0119394 A1* | 5/2013 | Zhu | H01L 29/872 257/76 |
| 2015/0060882 A1* | 3/2015 | Tarui | H01L 29/36 257/77 |
| 2015/0294921 A1* | 10/2015 | Viswanathan | H01L 23/367 257/76 |

FOREIGN PATENT DOCUMENTS

| | | |
|---|---|---|
| JP | 2005-175204 A | 6/2005 |
| JP | 2008-227116 A | 9/2008 |

OTHER PUBLICATIONS

An Office Action issued by Chinese Patent Office dated Sep. 21, 2017, which corresponds to Chinese Patent Application No. 201510640745.9 and is related to U.S. Appl. No. 14/796,674.

The first Office Action, "Notification of Rejection," issued by the Taiwanese Patent Office dated May 12, 2016, which corresponds to Taiwanese Patent Application No. 104121062 and is related to U.S. Appl. No. 14/796,674; with English language partial translation.

\* cited by examiner

SEMICONDUCTOR DEVICE

BACKGROUND OF THE INVENTION

Field of the Invention

The present invention relates to a semiconductor device provided with high humidity resistance.

Background Art

Rapid progress is being made in universal use of high-frequency semiconductor devices typified by field-effect transistor elements using compound semiconductors such as GaAs, GaN. Regarding high frequency semiconductor devices, there has been no need to consider influences of water from an external environment so far by maintaining a high level of hermeticity inside packages in which the semiconductor devices are mounted. However, in recent years, since package mounting is performed using low-priced plastic mold materials, cost reduction is increasingly being achieved. Since it is difficult to prevent permeation of water into plastic mold materials, how to secure humidity resistance of semiconductor devices is becoming an important factor in securing reliability of products.

A semiconductor device is proposed in which a guard ring is constructed of a conductive semiconductor in a peripheral region of a semiconductor device and part of the guard ring is exposed from an insulating film (e.g., see (FIG. 7 and FIG. 8, p. 29 of) Japanese Patent Application Laid-Open No. 2008-227116).

SUMMARY OF THE INVENTION

When a field-effect transistor (FET) is manufactured according to Japanese Patent Application Laid-Open No. 2008-227116, although it is assumed that it is possible to prevent degeneration of a semiconductor layer formed in a peripheral portion and prevent an impurity from intruding into the semiconductor device through a gap between the semiconductor layer and a protective film, and thereby improve humidity resistance, there are actually cases where the semiconductor of the guard ring exposed from the insulating film is corroded. For this reason, almost no superiority is found regarding the corrosion phenomenon in the semiconductor layer of the region peripheral to the chip over conventional semiconductor devices that do not adopt the configuration of Japanese Patent Application Laid-Open No. 2008-227116. Moreover, corrosion of the semiconductor of the guard ring gradually advances toward a drain electrode pad, causing even a metal part of the electrode pad to be corroded. This also secondarily causes cracking or peeling of the insulating film that protects the periphery of the pad, degrading the transistor region. This problem is conspicuous in GaN devices for which high-voltage operation is required.

In view of the above-described problems, an object of the present invention is to provide a semiconductor device provided with high humidity resistance.

According to the present invention, a semiconductor device includes: a semiconductor substrate having a main plane; a semiconductor element provided on the main plane of the semiconductor substrate; an electrode pad provided on the main plane of the semiconductor substrate and connected to the semiconductor element; a guard ring surrounding the semiconductor element and the electrode pad, and provided on the main plane of the semiconductor substrate; and an insulating film covering all region of a semiconductor of the main plane of the semiconductor substrate exposed inside the guard ring, wherein the insulating film is made of a water impermeable material.

In the present invention, the insulating film that covers the whole region where the semiconductor of the semiconductor substrate inside the guard ring is exposed is made of a water impermeable material. Thus, it is possible to obtain a semiconductor device provided with high humidity resistance.

Other and further objects, features and advantages of the invention will appear more fully from the following description.

DETAILED DESCRIPTION OF THE PREFERRED EMBODIMENTS

A semiconductor device according to the embodiments of the present invention will be described with reference to the drawings. The same components will be denoted by the same symbols, and the repeated description thereof may be omitted.

First Embodiment

Figure 1:
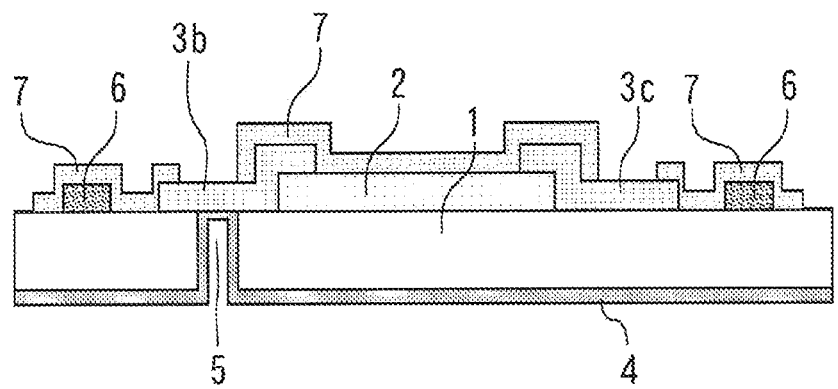
FIG. 1 is a cross-sectional view illustrating a semiconductor device according to a first embodiment of the present invention.
Figure 2:
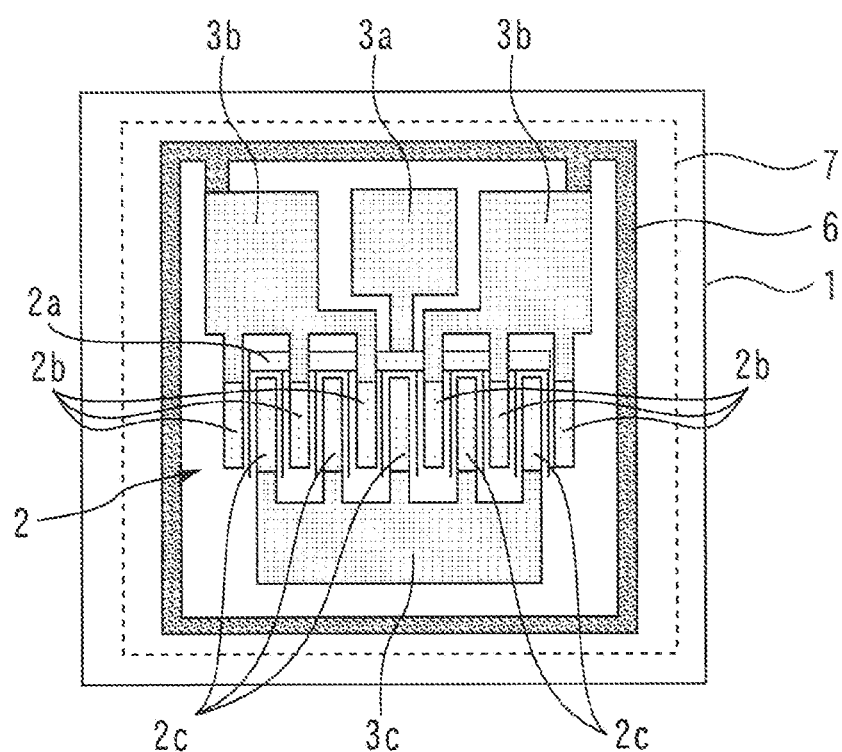
FIG. 2 is a plan view illustrating the semiconductor device according to the first embodiment of the present invention.

FIG. 1 is a cross-sectional view illustrating a semiconductor device according to a first embodiment of the present invention. FIG. 2 is a plan view illustrating the semiconductor device according to the first embodiment of the present invention. A semiconductor substrate 1 is any one of a Si substrate, GaAs substrate, InP substrate, SiC substrate and GaN substrate, and has a multilayered film structure of semiconductor for performing a predetermined transistor operation.

A semiconductor element 2 is provided on a main plane of the semiconductor substrate 1. The semiconductor element 2 here is a field-effect transistor element to be used for a high output amplifier, but it may also be a bipolar transistor element or the like. The semiconductor element 2 includes a gate electrode 2a, a source electrode 2b and a drain electrode 2c.

A gate electrode pad 3a, a source electrode pad 3b and a drain electrode pad 3c are provided on the main plane of the semiconductor substrate 1 and respectively connected to the gate electrode 2a, source electrode 2b and drain electrode 2c of the semiconductor element 2. A back metal film 4 is provided on the back of the semiconductor substrate 1 and the back metal film 4 is connected to the source electrode pad 3b via a via hole 5.

A guard ring 6 that surrounds the semiconductor element 2 and the electrode pads 3a, 3b and 3c is provided in a region peripheral to the chip on the main plane of the semiconductor substrate 1. An insulating film 7 covers all the region of the semiconductor of the semiconductor substrate 1 exposed from the electrodes 2a, 2b and 2c, and the electrode pads 3a, 3b and 3c inside the guard ring 6. Note that the region covered with anything other than the semiconductor such as the gate electrode pad 3a, the source electrode pad 3b and the drain electrode pad 3c need not be covered with the insulating film 7. These regions need to be electrically connected to the outside.

In the present embodiment, the guard ring 6 is made of a conductive semiconductor and the insulating film 7 also covers the whole guard ring 6. In the region on the side of the chip outside the guard ring 6, an inter-chip boundary region to be separated from a wafer into individual chips, and the insulating film 7 in the outermost circumferential part of the chip may be opened. The interface between the metal and the semiconductor on the side of the chip inside the guard ring 6 needs to be covered with the insulating film.

Here, the insulating film 7 is made of a water impermeable material or a material at least more water impermeable than a resin film. For example, it is preferable to use a silicon nitride film or the like capable of preventing permeation or diffusion of water as the insulating film 7. The silicon nitride film is often formed using plasma CVD and preferably formed under a condition similar to $Si_3N_4$ which is a stoichiometric composition. Generally, permeation or diffusion of water of the silicon nitride film fluctuates when it is deviated from a stoichiometric composition. For this reason, it is necessary to design a film thickness of the silicon nitride film enough to prevent water permeation up to each metal material making up the main plane of the semiconductor substrate 1 and transistor for the film forming condition of the silicon nitride film.

Figure 3:
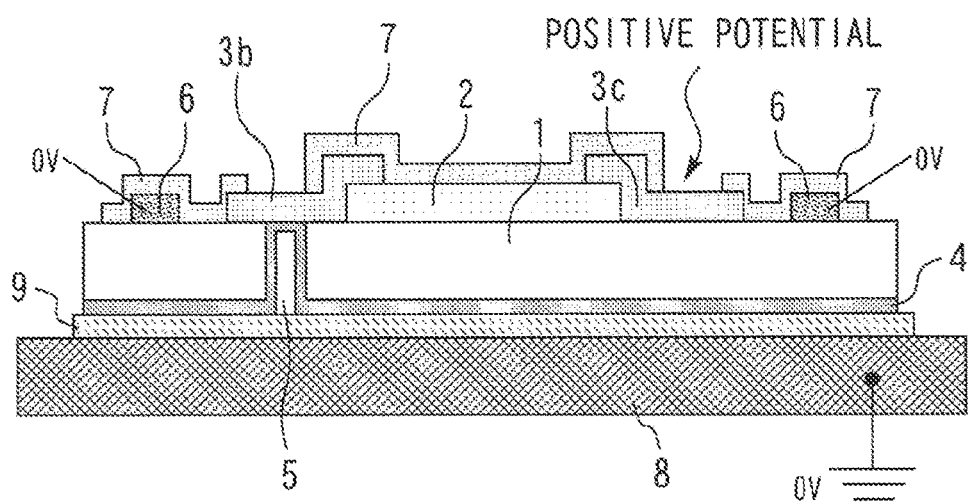
FIG. 3 is a cross-sectional view illustrating the semiconductor device according to the first embodiment of the present invention mounted in a package.

FIG. 3 is a cross-sectional view illustrating the semiconductor device according to the first embodiment of the present invention mounted in a package. The back metal film 4 of the semiconductor device is joined to a package base material 8 via a solder material 9. Since the package base material 8 is given a GND potential (0 V) which is a reference potential, the source electrode 2b of the semiconductor device is given the reference potential via the via hole 5 and the source electrode pad 3b. The guard ring 6 is also given the reference potential. No potential difference is produced in the semiconductor layer outside the guard ring 6, which is kept to 0 V. This prevents corrosion reaction by electrochemical reaction.

Although a potential difference is produced between the drain electrode pad 3c which is given a positive potential and the guard ring 6 which is given the reference potential, since the surface of the semiconductor is protected by the insulating film 7 or the metal electrode pads 3a, 3b and 3c, it is possible to eliminate influences of water. Therefore, it is also possible to prevent corrosion of the metal of the electrode pads 3a, 3b and 3c, cracking or peeling of the insulating film 7 or progression of degradation toward the transistor region, which are incidental to corrosion reaction of the semiconductor.

The insulating film 7 that covers the whole region where the semiconductor of the semiconductor substrate 1 inside the guard ring 6 is exposed is made of a water impermeable material. Thus, it is possible to obtain a semiconductor device provided with high humidity resistance.

When the guard ring 6 is made of a conductive semiconductor, the semiconductor of the guard ring 6 also becomes a starting point of corrosion reaction. However, the insulating film 7 covers the whole guard ring 6, and can thereby prevent corrosion reaction.

The semiconductor element 2 may also be an integrated circuit including a passive element such as resistor, capacitor or inductor. Regarding the region in which this passive element is formed, the region where the semiconductor of the semiconductor substrate 1 is exposed is also covered with the insulating film 7.

Second Embodiment

Figure 4:
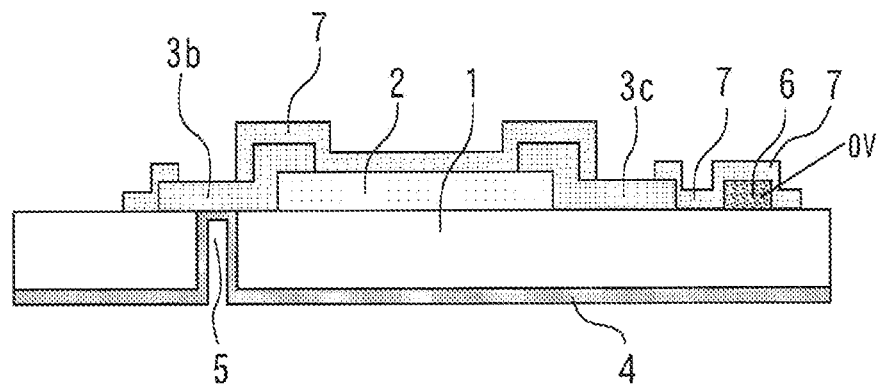
FIG. 4 is a cross-sectional view illustrating a semiconductor device according to a second embodiment of the present invention.
Figure 5:
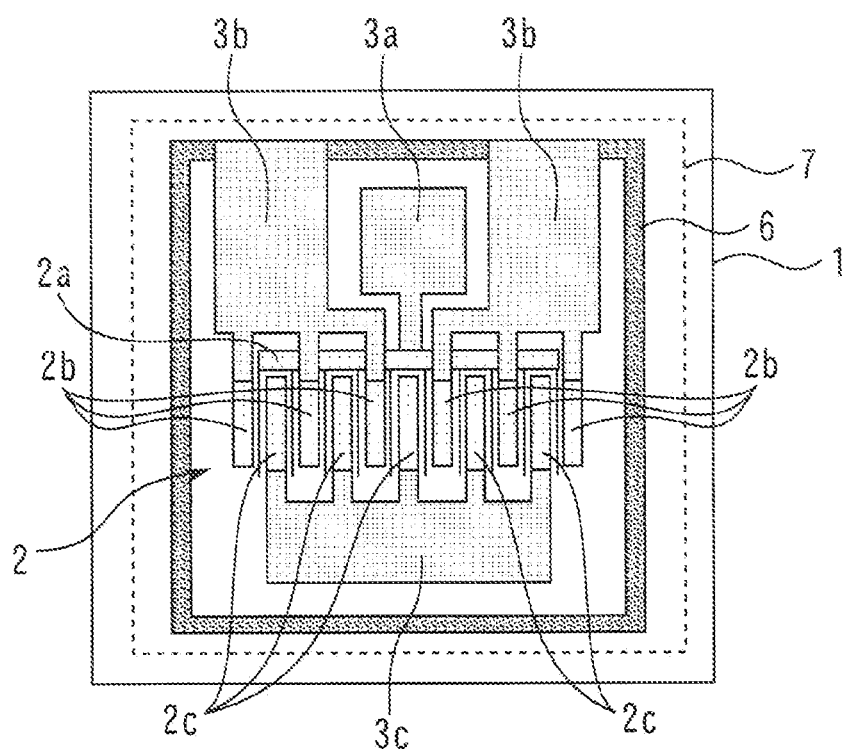
FIG. 5 is a plan view illustrating the semiconductor device according to the second embodiment of the present invention.
Figure 6:
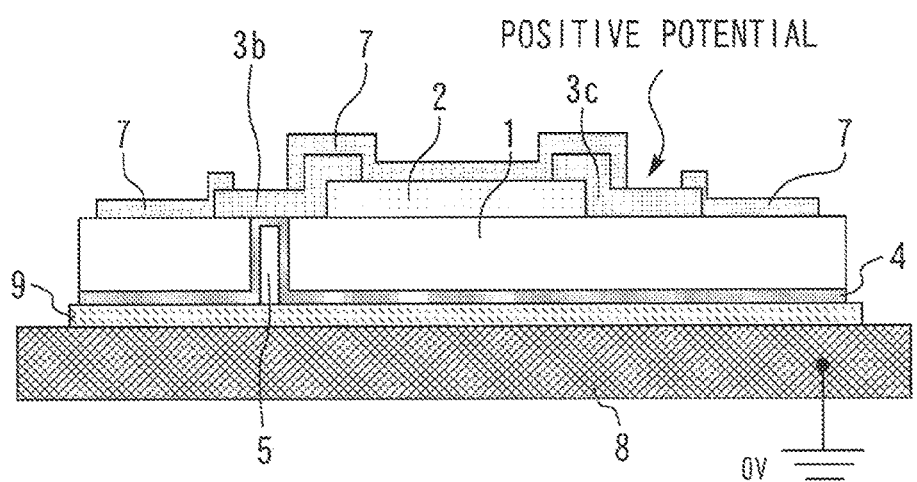
FIG. 6 is a cross-sectional view illustrating the semiconductor device according to the second embodiment of the present invention mounted in a package.

FIG. 4 is a cross-sectional view illustrating a semiconductor device according to a second embodiment of the present invention. FIG. 5 is a plan view illustrating the semiconductor device according to the second embodiment of the present invention. FIG. 6 is a cross-sectional view illustrating the semiconductor device according to the second embodiment of the present invention mounted in a package.

In the present embodiment, the guard ring 6 is metallic. The source electrode pad 3b also serves as part of the guard ring layer. The insulating film 7 covers the guard ring 6 and the insulating film 7 on the source electrode pad 3b (part of the guard ring 6) is opened. The rest of the configuration is similar to that of the first embodiment.

When the guard ring 6 is metallic, even when part of the guard ring 6 is exposed from the insulating film 7, the semiconductor which becomes a starting point of corrosion reaction is not exposed. Therefore, it is possible to obtain a semiconductor device with high humidity resistance as in the case of the first embodiment. Furthermore, when the guard ring 6 is metallic, even when the insulating film 7 on the side of the chip outside the guard ring 6 is opened, no potential difference is produced in the region from which the semiconductor on the side of the chip outside the guard ring 6 is exposed, which is kept to 0 V, and humidity resistance never deteriorates.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2014-204754, filed on Oct. 3, 2014 including specification, claims, drawings and summary, on which the Convention priority of the present application is based, is incorporated herein by reference in its entirety.

What is claimed is:

1. A semiconductor device comprising:
   a semiconductor substrate having a main surface;
   a semiconductor element provided on, and overlaying, the main surface of the semiconductor substrate;
   an electrode pad provided directly on the main surface of the semiconductor substrate and directly connected to the semiconductor element;
   a guard ring surrounding the semiconductor element and the electrode pad, and provided directly on the main surface of the semiconductor substrate such that a bottom surface of the guard ring is in direct contact with the semiconductor substrate; and
   an insulating film covering the semiconductor element when viewed in plan view and covering a portion of the main surface of the semiconductor substrate surrounded by the guard ring, the insulating film being in direct contact with a top surface and all side surfaces of the guard ring so as to prevent the guard ring from being exposed to an external environment and the insulating film being in direct contact with the main surface of the semiconductor substrate, wherein the insulating film is made of a water impermeable material.

2. The semiconductor device of claim 1, wherein the guard ring is made of a conductive semiconductor.

3. The semiconductor device of claim 1, wherein the guard ring is metallic.

4. The semiconductor device of claim 3, wherein the insulating film covers the guard ring and a through-hole in the insulating film is disposed on the electrode pad, thereby exposing at least a portion of the electrode pad.

5. The semiconductor device of claim 1, wherein the semiconductor element includes a passive element.

6. The semiconductor device of claim 1, wherein the semiconductor substrate is any one of a Si substrate, GaAs substrate, InP substrate, SiC substrate and GaN substrate.

7. The semiconductor device of claim 1, wherein the insulating film covers a portion of the semiconductor substrate outside the guard ring.

8. The semiconductor device of claim 1, wherein the guard ring is given a GND potential.

9. A semiconductor device comprising:
a semiconductor substrate having a main surface;
a semiconductor element on the semiconductor substrate, the semiconductor element including one or more electrodes;
an electrode pad connected to at least one of the one or more electrodes and extending between the at least one of the one or more electrodes and the semiconductor substrate;
a guard ring on the semiconductor substrate, the guard ring having a bottom surface in direct contact with the semiconductor substrate and surrounding the semiconductor element and the electrode pad; and
an insulating film in direct contact with a top surface and all side surfaces of the guard ring so as to prevent the guard ring from being exposed to an external environment, the insulating film also covering the semiconductor element and a portion of the semiconductor substrate surrounded by the guard ring when viewed in plan view, wherein the insulating film is made of a water impermeable material.

10. The semiconductor device of claim 9, wherein the guard ring is made of a conductive semiconductor.

11. The semiconductor device of claim 9, wherein the guard ring is metallic.

12. The semiconductor device of claim 11, wherein the insulating film covers the guard ring and a through-hole in the insulating film is disposed on the electrode pad, thereby exposing at least a portion of the electrode pad.

13. The semiconductor device of claim 9, wherein the semiconductor element includes a passive element.

14. The semiconductor device of claim 9, wherein the semiconductor substrate is any one of a Si substrate, GaAs substrate, InP substrate, SiC substrate and GaN substrate.

15. The semiconductor device of claim 9, wherein the one or more electrodes included in the semiconductor element comprise a source electrode and a drain electrode.

16. The semiconductor device of claim 15, wherein:
the electrode pad is a source electrode pad that is connected to the source electrode and extends between the source electrode and the semiconductor substrate, and
the semiconductor device further comprises a second electrode pad that is a drain electrode pad that is connected to the drain electrode and extends between the drain electrode and the semiconductor substrate.

17. The semiconductor device of claim 16, wherein:
a first through-hole in the insulating film is disposed on the source electrode pad, thereby exposing at least a portion of the source electrode pad, and
a second through-hole in the insulating film is disposed on the drain electrode pad, thereby exposing at least a portion of the drain electrode pad.

18. The semiconductor device of claim 9, wherein the electrode pad is electrically connected to the guard ring and the semiconductor element.

19. The semiconductor device of claim 9, wherein the electrode pad is electrically connected to a back film through a hole in the semiconductor substrate.

20. The semiconductor device of claim 9, wherein the guard ring is given a GND potential.

* * * * *